United States Patent [19]

Varadan et al.

[11] Patent Number: 4,948,922

[45] Date of Patent: Aug. 14, 1990

[54] ELECTROMAGNETIC SHIELDING AND ABSORPTIVE MATERIALS

[75] Inventors: Vijay K. Varadan; Vasundara V. Varadan, both of State College, Pa.

[73] Assignee: The Pennsylvania State University, State College, Pa.

[21] Appl. No.: 252,516

[22] Filed: Sep. 30, 1988

Related U.S. Application Data

[63] Continuation-in-part of Ser. No. 244,858, Sep. 15, 1988, abandoned.

[51] Int. Cl.$^5$ .............................................. H05K 9/00
[52] U.S. Cl. ........................... 174/35 GC; 174/35 MS; 342/1; 523/137
[58] Field of Search ...................... 174/35 MS, 35 GC; 342/1, 4; 523/137

[56] References Cited

U.S. PATENT DOCUMENTS

| | | | |
|---|---|---|---|
| 3,951,904 | 4/1976 | Tomonaga | 523/137 |
| 4,452,727 | 6/1984 | Frommer et al. | 252/500 X |
| 4,456,548 | 6/1984 | Lewis et al. | 252/518 X |
| 4,616,067 | 10/1986 | Lee et al. | 252/518 X |
| 4,678,716 | 7/1987 | Tzeng | 174/35 GC |

OTHER PUBLICATIONS

Varadan et al., *On the Possibility of Designing Anti-Reflection Coatings Using Chiral Composites*, Journal of Wave–Material Interaction, vol. 2, No. 1, Jan. 1987, pp. 71–81.
A. Lakhtakia et al., "A Parametric Study of Microwave Reflection Characteristics of a Planar Achiral-Chiral Interface", *IEEE Transactions on Electromagnetic Compatability*, vol. EMC-28, No. 2, May 1986.
D. L. Jaggard et al., "On Electromagnetic Waves in Chiral Media", *California Institute of Technology*, Antenna Lab., Report No. 93.
A. Lakhtakia et al., "Scattering and Absorption Charac. of Lossy Dielectric, Chiral, Nonspherical Objects", *Applied Optics*, vol. 24, No. 23, Dec. 1, 1985.
R. B. Kaner et al., "Plastics That Conduct Electricity", *Scientific American*, Feb. 1988.
D. L. Jaggard et al., "Chirosorb TM as an Invisible Medium", *Electronics Letters*, vol. 25, No. 3, Feb. 2, 1989.

*Primary Examiner*—Leo P. Picard
*Assistant Examiner*—David Tone
*Attorney, Agent, or Firm*—Burns, Doane, Swecker & Mathis

[57] ABSTRACT

A material having a matrix and a plurality of inclusions which are chiral is effective as a coating to reduce incident reflections and absorptions of microwave frequency electromagnetic energy. The matrix can use an electrically conductive polymeric material as the base as well as any other low loss dielectric material. Chiral inclusions may be in the form of helices or any other small object displaying handedness. Moreover, it is possible to use electrically conductive polymeric materials by themselves as absorbers of electromagnetic energy. There are a variety of uses for these materials and the unique properties including gaskets for controlling the emission of microwave energy from electronic enclosures.

21 Claims, 1 Drawing Sheet

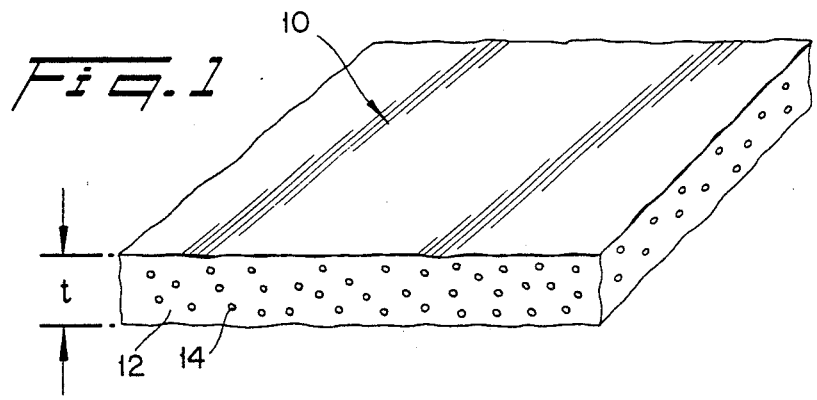
Fig. 1
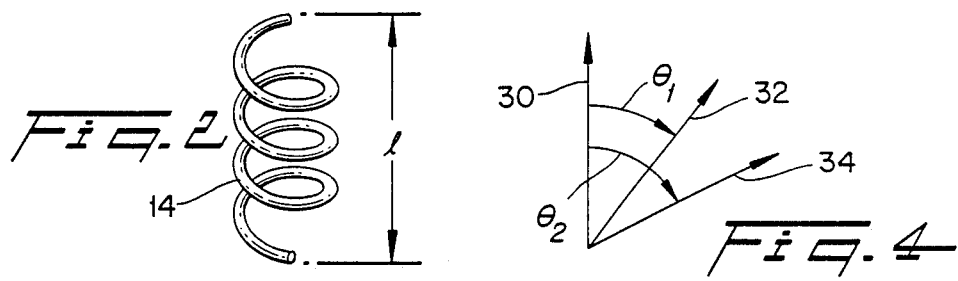
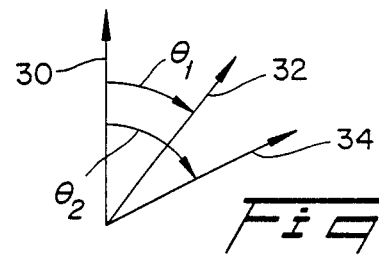
Fig. 2
Fig. 4
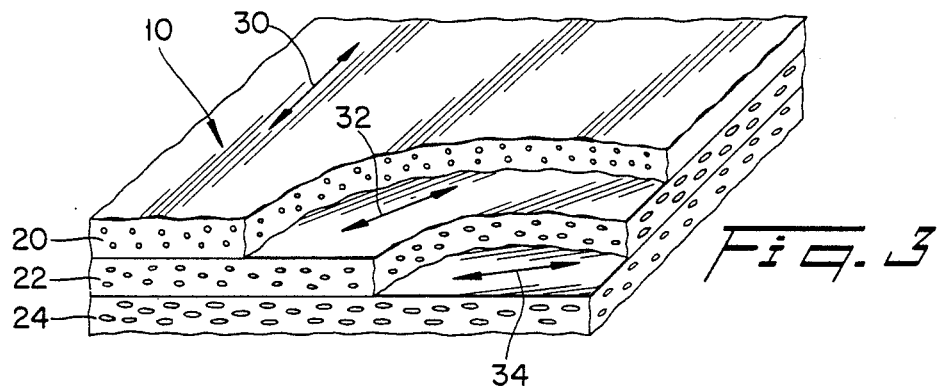
Fig. 3
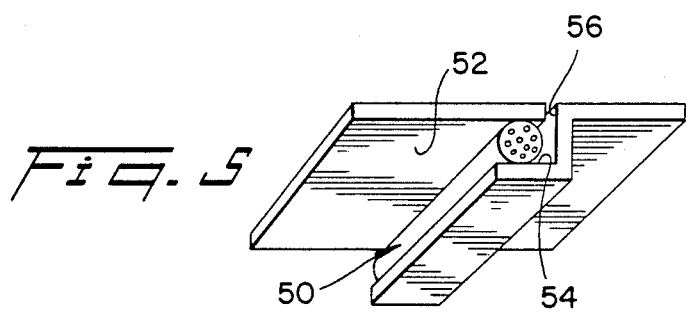
Fig. 5

ELECTROMAGNETIC SHIELDING AND ABSORPTIVE MATERIALS

CROSS REFERENCE TO RELATED APPLICATION

This application is a continuation in part of U.S. patent application Ser. No. 07/244,858, filed on Sept. 15, 1988, by V. K. and V. V. Varadan, and entitled "Electromagnetic Shielding and Absorptive Materials" now abandoned.

BACKGROUND OF THE INVENTION

The present invention deals generally with materials which exhibit electromagnetic shielding characteristics. More particularly, the present invention concerns materials which are interactive at microwave frequencies.

In many electronic enclosures, it is desirable to seal openings in the chassis so that various electromagnetic noise and signals do not escape into the surrounding environment and so that external signals do not enter the enclosure. For example, that electromagnetic noise can interfere with nearby television and radio equipment to the consternation of consumers.

In the past, that type of electromagnetic noise and associated signals have been controlled by designing enclosures which have openings that are much smaller than the wavelength of the electromagnetic noise involved. Where it is necessary to cover larger openings, such as for access openings, one past practice has been to use a suitable EMI/EMC gasket to surround the opening to provide electrical contact between the cover and the enclosure. In the industry, "EMI" refers to electromagnetic interference, "EMC" refers to electromagnetic control, and "EMS" refers to electromagnetic shielding. Those EMI/EMC gaskets are typically made from a metal-filled or solid metal material such as beryllium copper which is a good conductor and which is arranged to provide an electrical seal that can conform to an irregular surface which makes electrical contact with adjacent metallic surfaces. Those types that have openings or particle separations must be opaque to electromagnetic noise at the frequencies of interest.

Another problem area concerns electromagnetic reflections from buildings and the like that interfere with television and radio signal reception. For example, a group of tall buildings near one another can cause television signal reflections that result in a plurality of images on local television receivers. Such problems have, in the past, been overcome by use of community television and radio antennae which are placed so as to be free of the interfering reflections.

There have also been a number of engineering design problems which have not met with a readily available solution. More particularly, it is sometimes desirable to design a transmission or receiving antenna from a material which is a good reflector of electromagnetic signals but which is also a nonmetallic material so that it is not subject to attack through environmentally generated phenomena such as rust. Likewise, there are other applications for materials which would be good thermal insulators but which would have high reflectivity, or high absorbtivity of incident electromagnetic signals and noise. For example, a thermally insulated enclosure with a coating that is electromagnetically absorbent would find considerable utility in reducing the radio frequency emissions from some kinds of electronic equipment while increasing the acceptable range of environmental operating temperatures.

In short, it can be seen that the need continues to exist for materials which can be tailored to handle various kinds of incident electromagnetic noise and signals.

In considering the various characteristics of materials that might be useful in tailoring those materials to have specific electromagnetic characteristics, it was noted that the chirality of materials has not been the subject of much analysis or experimentation. A chiral material is one which is asymmetric and which exhibits either left-handedness or right-handedness. One example of a known chiral material is sugar. When a polarized light beam passes through a sugar solution, the light beam rotates through an angle which depends on the sugar molecule and its concentration. Heretofore such chirality of substances has been known and studied in connection with optical beams.

For example, in studies performed by I. Tinoco and M. P. Freeman, "The Optical Activity of Oriented Helices", *J. Phys Chem.* 61, 1196 (1957), experiments were performed on the electromagnetic activity of helices. Helices were selected as large scale models of sugar molecules. The actual helices used were copper springs about 2 centimeters long that were embedded in styrofoam and excited by low gigahertz frequency electromagnetic energy. Styrofoam is transparent to such electromagnetic energy but the helicies are not. Tinoco measured the resulting rotation of the field.

Another early author in the field worked out the electromagnetics of the optical rotation problem. C. F. Bohren, "Light Scattering by an Optically Active Sphere", *Chem. Phys. Lett.* 29, 458 (1974).

Propagation of electromagnetic waves through chiral media has been analytically examined. D. L. Jaggard, A. R. Mickelson, and C. H. Papas, "On Electromagnetic Waves in Chiral Media", *California Institute of Technology, Antenna Laboratory,* Report No. 93 (July 1978). Jaggard et al. analytically concluded that an electrically thin slab with randomly oriented helices effects a rotation of the plane of polarization and that both the reflected and transmitted electromagnetic fields can be analytically described.

Later work considered the effect of an electromagnetic field of microwave frequencies on a sphere made of a chiral material. A. Lakhtakia, V. K. Varadan, and V. V. Varadan, "Scattering and Absorption Characteristics of Lossy Dielectric, Chiral, Nonspherical Objects," *Applied Optics* Vol. 24, No. 23, (Dec. 1, 1985). In addition, the effect of chirality in a dielectric half-space was analytically investigated by A. Lakhtakia, V. V. Varadan, and V. K. Varadan, "A Parametric Study of Microwave Reflection Characteristics of a Planar Achiral-Chiral Interface", *IEEE Transactions on Electromagnetic Compatibility,* Vol. EMC-28, No. May 2, 1986.

While no such chiral material that is active at microwave frequencies is known to exist in nature, the work of these various authors assumed that such a material could exist and then went on to analyze it mathematically.

Thus, while no material exhibiting chiral properties at microwave frequencies occurs naturally, these studies have examined it as a mathematical curiosity. On a practical level, optical chirality has been used as a tool of analytical chemistry. But at best, any practical use for the chirality of materials in either the optical range of frequencies or the microwave range of frequencies is obscure.

Another category of materials which was considered as having interest in overcoming the problems with known materials in shielding of electromagnetic waves is the possibility of an electrically conductive polymeric material. For example, it is known that siloxane based polymers exhibit some electrically conductive properties. Moreover, it is known that such materials can be used to make electrical connections between two or more adjacent surfaces. However, the literature does not suggest that anyone appreciated the possibility that electrically conductive polymers may have electromagnetic shielding properties.

OBJECTS AND SUMMARY OF THE INVENTION

A general object of the invention is to provide a material having properties of microwave interaction that can be tailored to suit specific engineering applications.

Another general object of the invention is to make a useful object such as an electromagnetic shielding gasket from a material which exhibits microwave interaction.

Yet another general object of the invention is to use a composite material having chiral microgeometries as a medium to regulate reflectance, absorption, and transmission of microwave excitation.

Still another object of the invention is to employ the microwave interaction characteristics of an electrically conductive polymeric material as an absorbing device.

With these general objectives in mind, a material which provides these desirable characteristics is a composite material having an electrically conductive material with microwave absorbing characteristics in which are suspended a plurality of chiral microgeometries. The transmission, reflection, and absorption characteristics of the material can be tailored to desired levels by properly selecting the size of the chiral microgeometries and their density in the composite material.

The chiral microgeometries which are used in this invention may have intrinsic chirality or may even be structurally chiral. More particularly, the microgeometries may be helical elements like springs which have an inherent or intrinsic chirality. On the other hand, the microgeometries can be structurally chiral. For example, the microgeometries can be fashioned from layers of anisotropic material, with the anisotropy of successive layers being disposed at progressively increasing angles from the first layer.

In some instances, it will not be necessary to have an electrically conductive material for the composite in which the chiral microgeometries are suspended. In such situations, the matrix can be selected from any of a wide variety of dielectric materials. The condition on selection, however, is simply that the matrix material is a "lossy" dielectric material. Conventional plastic materials are suitable for the matrix.

In other applications, the presence of the chiral microgeometries is not specifically necessary. Here, the chiral microgeometries can be eliminated entirely and the electrically conductive polymeric material used for the matrix can be used alone in microwave active environments.

Further uses are readily envisioned for chiral materials in which structurally chiral materials are used by themselves without the presence of any matrix. For example, naturally anisotropic materials, such as mica sheets, can be arranged in layers with the axis of anisotropy of each layer being angularly disposed between the axes of anisotropy of each adjacent layer such that the axes of anisotropy of successive layers are angularly displaced in the same direction.

Gaskets which are active for electromagnetic shielding are convenient and particularly effective, and illustrate one example of the many useful articles that can be made from materials according to this invention.

BRIEF DESCRIPTION OF THE DRAWINGS

The above and many other objects and advantages of the present invention will be apparent to those skilled in the art when this application is read in conjunction with the attached drawings wherein like reference numerals have been applied to like elements and wherein:

FIG. 1 is a pictorial view of a chiral composite material according to the present invention;

FIG. 2 is an enlarged view of a chiral microgeometry or inclusion of the type suitable for use in the chiral composite of FIG. 1;

FIG. 3 is a pictorial view of a structurally chiral material with portions of the upper two layers broken away to illustrate the relative axes of anisotropy;

FIG. 4 is a schematic view showing the angular relationship between the axes of anisotropy of the layers in FIG. 3; and FIG. 5 is a perspective view of a gasket fabricated from the materials of the present invention.

DESCRIPTION OF PREFERRED EMBODIMENTS

Before commencing a description of the preferred embodiments, it is useful to define the meanings of various terms that are used hereafter.

For purposes of this specification, "chiral" means the absence of geometric symmetry between an object and its mirror image, and the mirror image of the object cannot be made to coincide with the object itself through any combination of translations and rotations. A convenient way of recognizing chirality is the concept of handedness: some objects are left-handed and other objects are right-handed. A left-handed object cannot be translated or rotated to cause it to coincide with a right-handed object.

An "intrinsically chiral" object is one in which the geometric shape of the object itself causes it to behave as a chiral object.

A "structurally chiral" object is one in which anisotropy of various parts of the object coupled with their angular relationship to other parts of the object causes chiral behavior.

An object which is not chiral is "achiral".

A "racemic" mixture of objects is a mixture of chiral objects where 50% of the objects exhibit left-handedness and the other 50% of the objects exhibit right-handedness. That is, there is no residual chirality of either left-handedness or right-handedness.

A "composite" material for purposes of this specification is one in which two or more materials coexist without chemical interaction, one or both phases can be discrete or continuous.

"Electrically conductive polymer" for purposes of this specification means that a polymer in which the product of the conventional conductivity and the frequency of the electromagnetic excitation lies in the range of $10^{-7}$ to $10^{+3}$ ohms per centimeter.

"Microwave frequencies" for purposes of this specification means electromagnetic wave frequencies between 150 megahertz and 100 gigahertz. Thus, this definition of microwave frequencies includes not only millimeter waves but also centimeter waves, as those terms are used in the field.

A "gasket" is an elongated resilient member adapted to be positioned between two surfaces at least one of which is relatively movable, operable to contact each of the two surfaces, at least slightly compressible between those two surfaces, and having a length which substantially exceeds characteristic cross-sectional dimensions of the member.

The theoretical basis for the behavior of chiral composite materials as well as other practical requirements of chiral composite materials are discussed in more detail in V. K. Varadan, V. V. Varadan, and A. Lakhtakia, "On the Possibility of Designing Anti-Reflection Coatings Using Chiral Composites", *Journal of Wave-Material Interaction*, Vol. 2, No. 1, which is incorporated herein by this reference thereto so as to be a part hereof. In addition, the general theoretical basis for the behavior of chiral composite materials can be generally understood from the following discussion. Chiral materials are distinguished from ordinary dielectric or magnetic materials through the new constitutive relations:

$$D = \epsilon E + \beta \epsilon \nabla \times E$$

$$B = \mu H + \beta \mu \nabla \times H$$

Where E and H are the electric and magnetic fields, respectively; D is the electric displacement; and B is the magnetic intensity. In the two foregoing equations, $\epsilon$ is the dielectric constant, $\mu$ is the magnetic permeability, and $\beta$ is a new material constant called the chirality parameter. The chirality parameter, $\beta$, is zero for non-chiral materials and is non-zero for chiral materials. After substitution of the two constitutive relations in the classical Maxwell equations, subsequent analysis indicates that left and right circularly polarized (LCP and RCP) fields are the eigenstates of a chiral material. Moreover, that analysis indicates that these polarizations propagate through a chiral material with distinct speeds, whereas for a non-chiral material, the two polarizations propagate at the same speed. In addition, for a non-chiral material, further linear polarization is also an eigenstate.

Accordingly, if electromagnetic waves of any polarization encounter a chiral/achiral interface, both the LCP and the RCP waves are scattered or reflected. In a composite material having a distribution of chiral inclusions, these waves undergo further multiple scattering and mode conversion from LCP to RCP and vice versa. The increases in effective path of the waves leads to absorption of electromagnetic waves even if the matrix material has a relatively low loss tangent. The loss tangent, tan $\delta$, is the ratio of the imaginary part of the complex dielectric constant to the real part of the complex dielectric constant. The complex dielectric constant, $\epsilon$, is expressed as:

$$\epsilon = \epsilon' + i\epsilon''$$

where $\epsilon'$ is the real part of the complex dielectric constant and $\epsilon''$ is the imaginary part of the complex dielectric constant. Thus, the loss tangent can also be expressed as follows:

$$\tan \delta = \frac{\epsilon''}{\epsilon'}.$$

Previous research by the inventors (see, A. Lakhtakia, V. K. Varadan, and V. V. Varadan, "Scattering and Absorption Characteristics of Lossy Dielectric, Chiral, Nonspherical Objects", *Applied Optics*, Vol. 24, No. 23, Dec. 1, 1985) has already indicated that the scattering cross-section of a chiral inclusion can be two or three orders of magnitude larger than that of an inclusion of the same size and shape and the same value of $\mu$ and $\epsilon$. That larger scattering crosssection has been shown to be due to additional terms in the induced surface charge and current density which will vanish when the chirality parameter, $\beta$, is zero. See, A. Laktakia, V. V. Varadan, and V. K. Varadan, "On the Influence of Chirality on the Scattering Response of a Chiral Scatterer, *IEEE Transaction on Electromagnetic Compatibility*, Vol. 29, 70–72 (1987). Those analytical studies were very sensitive to the numerical values for the chirality parameter, $\beta$, which were used in the simulation.

As those skilled in the art will appreciate from the definition above, geometry is the basis of chirality. Therefore, it is essential that the microstructure of a chiral material must have an excess of either right- or left-handed geometry. In the well-known phenomenon of optical activity at optical frequencies, chirality arises due to the right-or left-handed structure of the atoms or molecules. That optical activity is a type of chirality that is too microscopic to reveal itself in electromagnetic waves in the frequency range of 150 megahertz to 100 gigahertz. Chiral shapes with larger length scales do not occur naturally. Thus, one must construct artificial composites by distributing chiral microgeometries in a low or high loss matrix material which can then be considered at appropriate wavelengths to be an effectively chiral medium. Right- and left-handed helices are the simplest chiral shapes, but other shapes that can have a right- or left-handed configuration are equally acceptable.

Chirality thus provides a new and sensitive control parameter in the engineering and design of composite materials tailored for specific properties. The concept equally applicable to structural composites since shear waves in an elastic solid are transverse waves akin to electromagnetic waves. Thus, structural composites will respond differently to right- and left-handed microgeometries provided that they are of appropriate length scale.

There are a large variety of macroscopic objects considered to be chiral within the definition given above which produce the effects on electromagnetic waves noted above. For example, helices, Mobius strips, hands, feet, bones, and screws readily come to mind as representatives of this class of macroscopic object. In addition to macroscopic objects, there are also a large number of microscopic things which are chiral. In this class, fruit sugar molecules, dextrose molecules, polymethyl glutamate, and polymethyl methacrylate, come to mind.

When the microscopic objects are subjected to electromagnetic radiation, they only interact in the visual part of the electromagnetic spectrum since their size is the same order of magnitude as the wavelength of visible light. Where extremely large molecules are involved, they can be expected to interact with the electromagnetic spectrum in the microwave frequency range. Likewise, the macroscopic class of objects can also be expected to interact with the electromagnetic spectrum in the microwave frequency range since the characteristic size of these objects is comparable to the wavelength of electromagnetic radiation in the microwave frequency range.

A chiral composite 10 (see FIG. 1) which exhibits characteristics suggested by the foregoing theory of composite materials, may be made from a base material 12 in which a multiplicity of chiral microgeometries or inclusions 14 are distributed. Generally speaking, the inclusions 14 (see FIG. 2) should have a characteristic dimension 1 which is comparable to the wavelength of electromagnetic radiation in the microwave frequency range. In other words, the characteristic dimension 1 should be selected to be between 2 meters and 3 millimeters which correspond, respectively, to the microwave frequencies between 150 megahertz and 100 gigahertz. Even smaller inclusions 14 are also useful. Thus, due to practical considerations, the characteristic dimensions of the chiral inclusions should preferably be in the range of 0.01 to 5 millimeters. This range represents practical considerations of the size of objects that can be conveniently embedded in a matrix at sufficient densities to be electromagnetically effective.

The base, or matrix, material 10 (FIG. 1) should have a thickness t which exceeds the characteristic dimension 1 of the chiral inclusions 14 in order that the base material 12 can cover the chiral inclusions 14 and in order that at least one layer of the chiral inclusions can be present. In addition, the base material 12 should have lateral dimensions (in the plane of the layer) which substantially exceed the characteristic dimensions 1 of the chiral inclusions 14. In this manner, the resulting composite material 10 can be expected to have a large number of the chiral inclusions 14. It is, however, significant that there is no requirement that the composite material 10 be flat in order to be effective in the absorption, transmission, and reflection of incident electromagnetic radiation.

In addition, the base material 12 should have a dielectric constant which is complex in the range of frequency interest, which should lie within the frequency range of 150 megahertz to 100 gigahertz, and which is at least partially opaque to the electromagnetic energy in the range of frequency interest. The chiral inclusions 14 need to have a dielectric constant which is different from the dielectric constant of the base material 12. Generally the chiral inclusions 14 will be randomly dispersed through the base material 12.

It is possible to use only chiral inclusions 14 that are only left- or right-handed. However, mixtures of both left- and right-handed chiral inclusions can be used simultaneously in the same composite material. But, where mixtures of chiral inclusions are used, the mixture cannot be racemic, that is, no net chirality. It would also be within the scope of this invention to use mixtures of different kinds of chiral inclusions.

While the chiral inclusions 14 may be fashioned from metal, they may also be fashioned from non-metallic materials. However, where non-metallic materials such as a ceramic, a material with very long polymer chains (greater than a molecular weight of about 200,000), or any other dielectric material is used, it is important that the base material 12 be a lossy dielectric material and that there be a considerable difference between the dielectric constants of the chiral material and the base material 12. A lossy dielectric material is one which has a complex dielectric constant, that is, a material which can absorb microwave radiation. More specifically, the real and imaginary parts of the dielectric constant of the base material 12 should satisfy the following relationship:

$$\frac{\epsilon''}{\epsilon'} \geq 0.1$$

or, where the material has conductivity, $$\tan \delta = \frac{\text{sigma}}{\text{omega} * \text{epsilon}} \geq 0.1$$

where sigma is the imaginary part of the dielectric constant, epsilon is the real part of the dielectric constant, and omega is 2 * pi * frequency. It is perhaps appropriate to note at this point that if the real part of the complex dielectric constant is large, the material will generally exhibit high microwave reflection characteristics.

One particular base material 12 which has been found to be effective in the chiral composite material 10 is an electrically conductive polymeric material. For example, polymers based on siloxane are known to exhibit electrically conductive properties and are known to be chemically stable to temperatures up to 250° C., unlike other electrically conductive polymers like polyacetylenes. These electrically conductive polymeric materials are effective since they have a high loss tangent that aids microwave absorption during the multiple reflections resulting from microwave interaction with the chiral inclusions.

The foregoing types of chiral composite materials make use of intrinsically chiral objects. There is, however, another class of chiral materials which have chirality as a result of their structure. It is convenient to refer to these materials as structurally chiral.

In structurally chiral materials, the chirality is the result of fabrication from anisotropic materials. Mica is just one of many naturally occurring anisotropic materials which comes to mind. In mica, the material itself is anisotropic in its dielectric properties. Moreover, within a thin layer of mica, one can define an axis of anisotropy.

Parenthetically, it is noted that considerably more complex materials could also be used. For example, a biaxial dielectric material, triaxial dielectric material, or even more complex dielectric material could be used. In such cases, however, one of the axes of anisotropy would be selected.

When a plurality of sheets of mica are arranged in a stack such that the axes of anisotropy for the various layers are angularly disposed relative to the axis of anisotropy for the top layer such that the angle between (a) the axis of isotropy for the first layer and (b) the axis of isotropy for each of the other layers is greater as the layer involved in spaced further from the first layer, the stack of layers will also exhibit chiral properties.

While mica is a naturally occurring material, the concept of structural chirality can also be illustrated by other man-made materials. For example (see FIG. 3), it is possible to make individual layers 20, 22, 24 of fiber reinforced materials in which the reinforcing fibers are oriented so as to be generally parallel to one another. In such materials, the fibers could be glass, carbon, metal, Kevlar, or any other conventional filament used in reinforcing materials. Each layer of such a material will naturally exhibit much greater resistance to bending in the direction perpendicular to the lay of the reinforcing fibers than it will exhibit in other directions. Thus, the direction of the reinforcing fibers will define an axis of anisotropy for the particular sheet.

In the first layer 20, the reinforcing fibers extend generally in the direction of the double-ended arrow 30. Thus, the arrow 30 represents the axis of anisotropy of the first layer 20. Similarly, the reinforcing fibers of the second layer 22 extend in the direction of the double-ended arrow 32 which defines the axis of anisotropy for the second layer 22. And, the reinforcing fibers of the third layer 24 extend in the direction of the double-ended arrow 34 which defines the axis of anisotropy for the third layer 24.

The axes of anisotropy of the various layers of the structurally chiral material are progressively displaced from the axis of anisotropy of the top layer 30. For example (see FIG. 4) the axis of anisotropy 32 for the second layer is disposed at a predetermined angle, $\Theta_1$, relative to the axis of anisotropy 30 of the first layer. Similarly, the axis of anisotropy 34 for the third layer is oriented at an angle, $\Theta_2$, relative to the axis of anisotropy 30 of the first layer. The angle, $\Theta_2$, is greater than the angle $\Theta_1$ so that the lower layers of the structurally chiral material continually turn further away from the axis of anisotropy of the first layer. If there are successive layers in the structurally chiral material, then the axis of anisotropy for each of those successive layers will have a similar relationship to the axis 30 of the first layer.

When a structurally chiral composite material 10 is put together such that there is a progressive angular displacement of the axes of isotropy for the successive layers of the material, any article made from that product is structurally chiral.

Where a composite material is fashioned from an electrically conductive polymer and chiral inclusions, the chirality can be either of the intrinsic type or of the structural type.

It is also possible to use the electrically conductive polymeric material by itself for shielding applications to cut down transmission where reflection is not important.

It is envisioned that a particularly useful application for the tailored properties of chiral composite materials is the manufacture of gaskets and coatings for use in controlling, reducing, and even eliminating electromagnetic leakage from enclosures. As noted, gaskets 50 themselves (see FIG. 5), are generally elongated and are positioned between two surfaces 52, 54, at least one surface 52 being relatively movable in relation to the gasket 50. Moreover, the gasket 50 is usually at least slightly compressed between the two surfaces 50, 52. That compression assures electrical contact between the surfaces 50, 52 as well as elimination of unexpected gaps around the seal through which electromagnetic radiation could leak.

Where the gasket 50 is made from a chiral composite material, the gasket 50 is effective in reducing the transmission of electromagnetic radiation through the opening 56 defined between the two surfaces 52, 54.

The particular chiral composite material can, of course, be either one in which there are intrinsically chiral inclusions or one which is structurally chiral. In the case of the intrinsically chiral inclusions, the matrix can be either a generally low loss dielectric material or an electrically conductive polymeric material. It is also possible to make the gasket entirely from an electrically conductive polymeric material which is free of chiral inclusions. In any event, the gasket has been found to exhibit extraordinary absorption of incident electromagnetic radiation of microwave frequency.

In the following discussion of Examples 1-6, it should be noted that only left- or right-handed chiral inclusions were used, not a mixture of both.

EXAMPLE 1

In this first example, chiral inclusions in the form of copper wire springs were dispersed in a low loss dielectric polymer. The particular polymer used is an epoxy. For this example, the polymer was "Eccogel" which is sold by Emerson & Cummings of Canton, Mass. The copper springs were fabricated from wire 0.006 inches in diameter. The springs themselves had a diameter of 1 millimeter and lengths in the range of 1.5 to 4 millimeters.

After the composite material of this example was subjected to electromagnetic radiation with frequencies in the range of 8 to 18 gigahertz, it was observed that the incident electromagnetic radiation was rotated as it passed through the composite material. In addition, measurement of the electromagnetic absorption of the composite material was made. The resulting absorption of the composite material was greater than would be expected from the absorption characteristics of the constituent materials alone would suggest.

Additional tests were made to examine the effect of the concentration of the copper springs on the absorption characteristics of the composite material. As a result of these additional tests, it was discovered that absorption characteristics of the composite material improve with greater concentrations of the copper springs up to a concentration of about 3% by volume. The upper limit here is believed to be caused by the fact that at 3 volume percent, there are a sufficient number of springs that the distances between adjacent springs become so small that the composite matrix resembles a metal screen that reflects incident microwave radiation. The use of a ceramic or dielectric material for the chiral inclusions would avoid this limitation.

EXAMPLE 2

In this example, the matrix material was the same as that used in Example 1. The chiral inclusions were nylon springs. As in Example 1, this example was subjected to electromagnetic radiation with frequencies in the range of 8 to 18 gigahertz. This example did not yield meaningful results since the nylon material of the springs melted in the matrix material when the composite material was being fabricated.

EXAMPLE 3

In this example, the matrix material was the same as that used in Example 1. The chiral inclusions were nylon screws.

When this composite material was exposed to microwave radiation with frequencies in the range of 8 to 18 gigahertz, there was no perceptible effect of the chirality of the inclusions on the absorption of the incident microwave radiation. This result is believed to be a result of the fact that the dielectric constants of the matrix material are too close to the dielectric constants of the springs. Moreover, with screws, the chirality is in the threads, as opposed to a spring where the entire body is chiral. Accordingly, it has been concluded that the dielectric constants of the matrix and the chiral inclusions must be substantially different.

EXAMPLE 4

In this example, the matrix was the same as the matrix used in Example 1. The chiral inclusions here were in the form of on optically active chiral powder, gamma-metal glutamate.

When this material was subjected to microwave radiation at frequencies in the range of 8 to 18 gigahertz, the microwave absorption of the resulting composite material was much higher than the sum of the absorptivities of the two components of the composite would have suggested.

This particular powder was, however, difficult to work with. It is expected that it would be desirable to encapsulate the powder in microcapsules and disperse a high concentration of those microcapsules through the matrix material.

EXAMPLE 5

In this example, a structurally chiral sample was made from layers of fiber reinforced material. The particular material used was glass reinforced composite P2E285-12" F155 tape, from the B. F. Goodrich Co. In this material, the reinforcing fibers are substantially parallel. In addition, the parallelism of the reinforcing fibers defines an axis of anisotropy for each corresponding layer of the material. The axes of isotropy for the various layers were arranged relative to the top layer such that there was an increasing angle between the axis of anisotropy for each successive layer when measured from the top layer. Ultrasonic tests show chirality.

EXAMPLE 6

In this example, the matrix was a proprietary electrically conductive polymer supplied by Tetrahedron International, State College, PA. The particular polymer is a blend of a silicone polymer, a non-silicone polymer, polysiloxane, and electron withdrawing groups. The electron withdrawing groups may be carboxyl groups or carbonyl ions. The chiral inclusions used in this example were metal springs of the type described in Example 1. The composite material formed from these ingredients was about 5 millimeters thick.

When the composite material of this example was subjected to microwave radiation at frequencies in the range of 8 to 18 gigahertz, it was found that the material was an excellent absorber of the incident radiation. For comparison purposes, it noted that the absorption of this sample of composite material was much better than a graded ferrite or carbon absorber having a thickness of 25 to 30 millimeters.

EXAMPLE 7

In this example, the electrically conductive polymer of Example 6 was tested by itself by exposing it to microwave radiation at frequencies in the range of 8 to 18 gigahertz and to frequencies in the range of 26 to 60 gigahertz.

This example indicated that the electrically conductive polymeric material was a good absorber of microwave radiation and had a relatively low reflection coefficient. However, this electrically conductive polymeric material had excellent properties for use as an electromagnetic shielding material in that its transmission properties were very low and that there was relatively high absorption.

From the results of the foregoing experiments, we have concluded that our understanding of the theory underlying the interaction of microwave energy with composite materials having chiral inclusions is sound and permits electromagnetically interactive materials to be designed with desirable properties.

As noted above, the tests above were generally done with chiral inclusions all having the same handedness. Preliminary results on non-racemic mixtures of chiral inclusions exhibit some of the desirably absorption properties but those properties are not as desirable as those obtained with chiral inclusions of the same handedness.

In addition, it will be noted that where chiral inclusions are fashioned from non-metallic materials, those chiral inclusions can be used with concentrations as great as 20-30 volume percent. This upper range is considerably higher than the range available for metallic chiral inclusions since these non-metallic inclusions do not experience the electrical shorting which can occur with metallic inclusions.

Where it is desired to design a material with specific properties (for a given electromagnetic frequency) of high reflection, low reflection, and/or low absorption, the chirality parameter, $\beta$, the complex dielectric constant of the chiral inclusion, $\epsilon_1$, the complex dielectric constant of the base material, $\epsilon_2$, the geometrical parameters of the chiral inclusions, the dispersion statistics for the chiral inclusions, and the concentration of the chiral inclusions are varied to accomplish the desired properties.

In general, the chirality parameter, $\beta$, for the composite material is dependent on the geometrical parameters of the chiral inclusions, the electrical properties of those inclusions, and the dispersion characteristics of those inclusions. In most material designs there is a range of electromagnetic frequencies which are of special interest. In such designs, it is desired that the chirality parameter, $\beta$, be as close as possible to:

$$\frac{1}{2\pi f \sqrt{\mu\epsilon}}$$

where f is the frequency of electromagnetic energy of interest, $\mu$ is the complex magnetic permittivity of the composite material, and $\epsilon$ is the complex dielectric constant for the composite material.

Where the material being designed is to exhibit highly relective properties, the impedance of the chiral composite material is selected to be different from the impedance of the medium adjacent to the chiral composite, i.e., through which the incident electromagnetic radiation travels before impinging the chiral composite. In many cases, that medium will be air and the impedance of the chiral composite will therefore be selected to be different from the impedance of air. Naturally, the further apart the impedances are, the better the reflection characteristics will be.

Where the composite material is being designed is to exhibit low electromagnetic transmission properties, the chiral material should exhibit good attenuation properties through both absorption and scattering phenomena. The necessary amount of attenuation will depend upon the particular application and the amount of transmission which is acceptable. Generally, higher densities of chiral inclusions will give rise to increased scattering attenuation while the characteristics of the base material will be primarily effective as the cause of absorption. In addition, the geometrical characteristics and the dispersion characteristics of the chiral inclusions will be significant in the amount of scattering attenuation.

Where the material is being designed to have low reflection characteristics as well as low transmission characteristics, then (i) the chiral material should exhibit good attenuation properties through both absorption and scattering phenomena, and (ii) the impedance of the chiral composite material should be selected to be as close as possible to the impedance of the medium adjacent to the chiral composite, i.e., through which the incident electromagnetic radiation travels before impinging the chiral composite. As discussed, in many cases that medium will be air and the impedance of the chiral composite will therefore be selected to be close to the impedance of air.

The geometric parameters which are significant in the chirality parameter, $\beta$, will depend on the geometry of the chiral inclusions. For example, where the chiral inclusions are in the shape of helices, the geometric parameters include the pitch of the helix, the number of turns in the helix, the radius of the turns of the helix, and the gauge or diameter of the helix material.

There are, of course, many interesting uses that can be made of the new materials which are disclosed above. While the following list is not intended to be exhaustive in scope, it will serve to illustrate a part of the spectrum of uses which is available.

The materials of this invention can be used either as structural elements themselves or as coatings for other parts, surfaces, and the like. A chiral composite material according to this invention can be designed which would be a thermal insulator and which would reflect incident microwave energy. Such a material could, for example, find usefulness in conventional microwave ovens as a replacement for the metallic walls surrounding the heating chamber. Walls made of such a reflecting dielectric material would be lighter and could help reduce the weight of present microwave ovens.

A chiral composite material could also be used as a microwave polarizer. Presently, there are known ferromagnetic polarizers which are operable at microwave frequencies. The known ferromagnetic polarizers, however, are non-reciprocal. That is, conventional optical polarizers are typically planar with two sides. Those conventional optical polarizers are effective whether light enters from either side. By contrast, the known ferromagnetic polarizers are operable to polarize a microwave signal only if that signal enters from one side. Thus, they are non-reciprocal. A microwave polarizer made from a chiral composite material would represent a marked improvement over the ferromagnetic polarizers since the chiral composite polarizer would be reciprocal. Further advantages of a chiral composite polarizer in relation to the ferromagnetic polarizer are the smaller size, lighter weight, and the elimination of hysteresis effects which are made possible through use of the chiral composite. Moreover, the chiral composite polarizer would permit other polarizations to be obtained without incurring the problem of magnetic hysteresis that is present in ferromagnetic polarizers.

The use of a reflective chiral coating also makes possible a microwave mirror in which an incident electromagnetic field that is right-handed can be reflected from a generally planar surface as a left-handed field, and vice-versa. Such a microwave mirror would have utility in the signal processing field. At present, there is no known comparable device. The reflective chiral coating would result in a device which operates at a broad band of frequencies and would thus be very much unlike a turnstile junction which operates at a single frequency.

Chiral composite coatings will also find considerable use as electromagnetic shielding materials which are designed to reflect incident electromagnetic radiation without transmitting it. Examples of the way in which such a coating could be used are microwave reflecting paints for the inside of conventional microwave ovens, optically transparent and electromagnetically reflective coatings for CRT terminals, and exterior paints for buildings in metropolitan areas to absorb incident electromagnetic radiation. Thus, such coatings can be reflective and be used to keep electromagnetic radiation either in or out, or can be designed to be absorptive and used to be non-reflective.

Electrically conductive polymeric materials according to this invention which have electromagnetic absorption and reflective properties are also useful by themselves in the absence of chiral microgeometries. These electrically conductive polymeric materials may for example be used in applications where thermal insulators are necessary. In addition, these electrically conductive polymeric materials can be used for electromagnetic shielding devices as generally described above.

However, electrically conductive polymeric materials when used by themselves, also have a variety of additional unique uses. More particularly, an electrically conductive polymeric material could be made such that it is optically transparent and heatable. Such a material would find usefulness as a coating for automobile windshields that could be heated to function as a defogger that is entirely free of wires.

Another unique application for an electrically conductive polymeric material is in the production of a new class of semiconductors. Generally semiconductors have conventional electrical conductivity which lies in the range of $10^{+1}$ to $10^{+3}$. By simply adjusting the electrical conductivity of the electrically conductive polymeric material, it can provide a material which is then substitutable for a semiconductor in the classical sense.

Other unique applications for electrically conductive polymeric materials include lightweight batteries, photoresistors, and photo initiators.

It is also possible that electrically conductive polymeric materials would find use as conformal coatings for circuit boards which coatings are operable to permit conventional electrical conductivity but are effective to absorb electromagnetic radiation so that cross-talk between adjacent devices is severely reduced, and/or eliminated.

Since it is also possible to design electrically conductive polymeric materials from materials which are hydrophobic, electrically conductive polymeric materials may also be used to make electromagnetic shielding devices, including gaskets, which yield not only electromagnetic shielding but environmental shielding as well.

When a chiral composite utilizes the electrically conductive polymeric material as a matrix material, then the characteristics of both materials can be optimized to give even further varieties of materials. Moreover, if the microwave absorption characteristics of both materials are maximized, then a thinner coating can be used and still have the desired level of electromagnetic absorption.

It will now be apparent that a new and improved material has been disclosed herein along with a new and improved gasket made from that material. Moreover, it will be apparent to those of ordinary skill in the art that there are numerous modifications, variations, substitutions and equivalents of the features of this invention which do not materially depart from the spirit and scope of the invention. Accordingly, it is expressly intended that all such modifications, variations, substitutions and equivalents which fall within the spirit and scope of this invention as defined by the appended claims be embraced thereby.

What is claimed is:

1. A composite material comprising:
    a base material having a first dielectric constant which is complex in the frequency range of 150 megahertz to 100 gigahertz, and being at least partially opaque to electromagnetic energy with frequencies in the range of 150 megahertz to 100 gigahertz; and
    a chiral material having handedness, having a second dielectric constant which is different from the first dielectric constant, and being dispersed throughout the base material.

2. The composite material of claim 1 wherein substantially all of the chiral microgeometries have the same handedness.

3. The composite material of claim 1 wherein:
    the chiral material is in the form of microgeometries which are surrounded by the base material.

4. The composite material of claim 3 wherein:
    the microgeometries have a length and a width, the length being greater than the width thereof.

5. The composite material of claim 4 wherein:
    the length of the microgeometries lies in the range of 0.01 to 5 millimeters.

6. The composite material of claim 3 wherein:
    the microgeometries are metallic.

7. The composite material of claim 6 wherein the chiral material is no greater than about 3% by volume of the composite material.

8. The composite material of claim 6 wherein the microgeometries are in the form of helices.

9. The composite material of claim 3 wherein the microgeometries are nonmetallic.

10. The composite material of claim 9 wherein the microgeometries are ceramic springs.

11. The composite material of claim 9 wherein the microgeometries are no more than 20% by volume of the composite material.

12. The composite material of claim 1 wherein:
    the chiral material is in the form of microgeometries having a characteristic dimension, the microgeometries being surrounded by the base material; and
    the base material has a thickness which exceeds the characteristic dimension of the microgeometries and has a lateral dimension which is substantially larger than the characteristic dimension.

13. The composite material of claim 1 wherein:

$$\frac{\epsilon''}{\epsilon'} \geq 0.1$$

where $\epsilon''$ is the imaginary part of the complex dielectric constant, and $\epsilon'$ is the real part of the complex dielectric constant.

14. The composite material of claim 1 wherein the first material is an electrically conductive polymeric material having microwave energy absorption characteristics.

15. A composite material which is intrinsically anisotropic and structurally chiral comprising:
    a first layer of anisotropic material having an axis of anisotropy lying in the layer;
    a second layer of anisotropic material having an axis of anisotropy lying in the second layer, the axis of anisotropy for the second layer being positioned at a first predetermined angle from the axis of anisotropy for the first layer; and
    a third layer of anisotropic material having an axis of anisotropy lying in the third layer, the axis of anisotropy for the third layer being positioned at a second predetermined angle from the axis of anisotropy for the first layer, the second predetermined angle being larger than the first predetermined angle.

16. The composite material of claim 15 wherein:
    each layer is fashioned from a naturally anisotropic material.

17. The composite material of claim 16 wherein the anisotropic material is mica.

18. The composite material of claim 15 wherein the anisotropic material is a filament reinforced material in which the filaments of the material are substantially parallel and in which the filaments of the material define the axis of anisotropy for the material.

19. The composite material of claim 15 further including additional layers of anisotropic material, each successive layer having an axis of anisotropy, and the axis of anisotropy of each successive layer being disposed at a progressively greater angle relative to the angle of anisotropy of first layer than is the angle for the next adjacent layer counting in the direction of the first layer.

20. A gasket operable to shield electromagnetic wave propagation through a space defined between two surfaces, comprising an elongated resilient member having a characteristic transverse dimension, a length which substantially exceeds the characteristic transverse dimension, exhibiting transverse compressibility, and fashioned from a composite material including a substantially continuous phase having a plurality of chiral inclusions therein, each chiral inclusion having a characteristic size which is substantially smaller than the characteristic transverse dimension.

21. A gasket operable to shield electromagnetic wave propagation through a space defined between two surfaces, comprising an elongated resilient member having a characteristic transverse dimension, a length which substantially exceeds the characteristic transverse dimension, exhibiting transverse compressibility, and fashioned from a composite material including a substantially continuous phase of an electrically conductive polymeric material, the continuous phase having a plurality of chiral inclusions therein, each chiral inclusion having a characteristic size which is substantially smaller than the characteristic transverse dimension.

* * * * *

REEXAMINATION CERTIFICATE (1836th)
United States Patent [19]
Varadan et al.

[11] B1 4,948,922

[45] Certificate Issued  Nov. 3, 1992

[54] ELECTROMAGNETIC SHIELDING AND ABSORPTIVE MATERIALS

[75] Inventors: Vijay K. Varadan; Vasundara V. Varadan, both of State College, Pa.

[73] Assignee: The Pennsylvania Research Organization, University Park, Pa.

Reexamination Request:
No. 90/002,396, Aug. 7, 1991

Reexamination Certificate for:
Patent No.: 4,948,922
Issued: Aug. 14, 1990
Appl. No.: 252,516
Filed: Sep. 30, 1988

Related U.S. Application Data

[63] Continuation-in-part of Ser. No. 244,858, Sep. 15, 1988, abandoned.

[51] Int. Cl.$^5$ ............................................. H05K 9/00
[52] U.S. Cl. .......................... 174/35 GC; 174/35 MS; 342/1; 343/756; 523/137

[56] References Cited

U.S. PATENT DOCUMENTS 2,841,786  7/1958  Dicke ................................ 343/825

OTHER PUBLICATIONS

Varadan et al., "On the Possibility of Designing Antireflection Coatings Using Chiral Composites," *Journal of Wave Material Interaction,* vol. 2, No. 1 (Jan. 1987), pp. 71–81.
D. L. Jaggard et al., *Applied Physics,* 18, 211, 1979.
Tinoco et al., "The Optical Activity of Oriented Helices," *J. Phys. Chem.,* 61, 1196 (1957).
A. Lakhtakia et al., "Scattering and Absorption Characteristics of Lossy Dielectric, Chiral, Non-Spherical Objects," *Applied Optics,* vol. 24, No. 23 (Dec. 1, 1985).
A. Lakhtakia et al., "A Parametric Study of Micro Reflection Characteristics of a Planar Achiral-Chiral Interface," *IEEE Transactions on Electromagnetic Compatibility,* vol. EMC-28, No. 2 (May 1986).
S. Bassiri et al., *Alta Frequenza,* 2, 83, 1986.
S. Bassiri et al., *J. Opt. Soc. Am.* A5, 1450, 1988.
M. Ali Omar, *Elementary Solid State Physics,* pp. 163–166; 389–394 (1975).

*Primary Examiner*—Leo P. Picard

[57] ABSTRACT

A material having a matrix and a plurality of inclusions which are chiral is effective as a coating to reduce incident reflections and absorptions of microwave frequency electromagnetic energy. The matrix can use an electrically conductive polymeric material as the base as well as any other low loss dielectric material. Chiral inclusions may be in the form of helices or any other small object displaying handedness. Moreover, it is possible to use electrically conductive polymeric materials by themselves as absorbers of electromagnetic energy. There are a variety of uses for these materials and the unique properties including gaskets for controlling the emission of microwave energy from electronic enclosures.

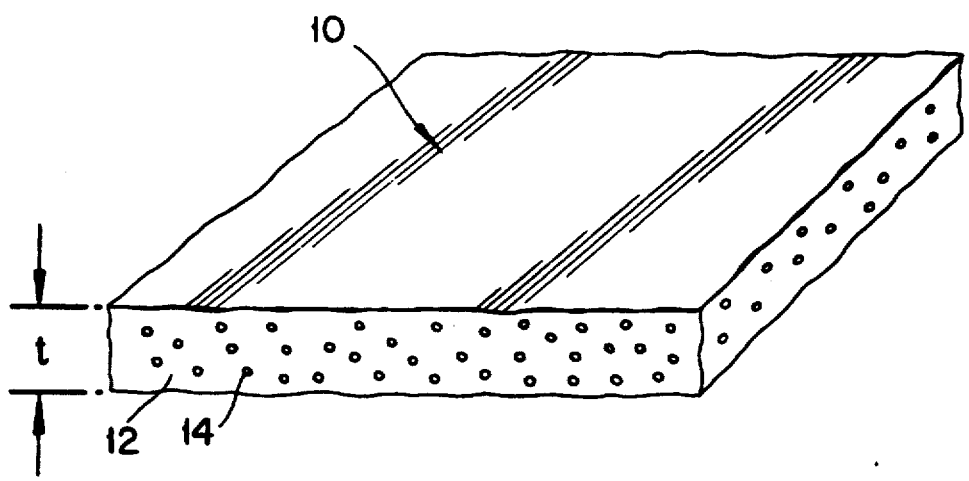

REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

The patentability of claims 15-21 is confirmed.

Claims 10, 13 are cancelled.

Claim 1 is determined to be patentable as amended.

Claims 2-9, 11, 12, 14, dependent on an amended claim, are determined to be patentable.

1. A composite material comprising:
   a base material having a first dielectric constant which is complex in the frequency range of 150 megahertz to 100 gigahertz, and being at least partially opaque to electromagnetic energy with frequencies in the range of 150 megahertz to 100 gigahertz, *said first dielectric constant having a ratio of its imaginary part to its real part that is at least equal to or greater than 0.1*; and
   a chiral material having handedness, having a second dielectric constant which is different from the first dielectric constant, and being dispersed throughout the base material.

* * * * *